(12) United States Patent
Yoshida et al.

(10) Patent No.: US 11,470,378 B2
(45) Date of Patent: Oct. 11, 2022

(54) TUNER DEVICE

(71) Applicant: Sony Semiconductor Solutions Corporation, Kanagawa (JP)

(72) Inventors: Toshikazu Yoshida, Kanagawa (JP); Hiroshige Takakuwa, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/052,024

(22) PCT Filed: Mar. 20, 2019

(86) PCT No.: PCT/JP2019/011629
§ 371 (c)(1),
(2) Date: Oct. 30, 2020

(87) PCT Pub. No.: WO2019/216030
PCT Pub. Date: Nov. 14, 2019

(65) Prior Publication Data
US 2021/0235146 A1    Jul. 29, 2021

(30) Foreign Application Priority Data
May 7, 2018 (JP) .............................. JP2018-089265

(51) Int. Cl.
*H04N 21/426* (2011.01)
*H04N 21/61* (2011.01)
*H05K 9/00* (2006.01)

(52) U.S. Cl.
CPC ... *H04N 21/42607* (2013.01); *H04N 21/6143* (2013.01); *H05K 9/0007* (2013.01)

(58) Field of Classification Search
CPC ......... H04N 21/42607; H04N 21/6143; H05K 9/0007
See application file for complete search history.

(56) References Cited

U.S. PATENT DOCUMENTS 3,987,263 A * 10/1976 Ogasawara ............ H01H 15/02
200/550
5,913,173 A 6/1999 Ohwaki
(Continued)

FOREIGN PATENT DOCUMENTS

CN    1268812 A    10/2000
CN    101137020 A    3/2008
(Continued)

OTHER PUBLICATIONS

Ministry of Internal Affairs and Communications Ordinance No. 76, Partial revision of radio equipment regulations (Article 24). 38 pages.
(Continued)

*Primary Examiner* — Joshua D Taylor
(74) *Attorney, Agent, or Firm* — K&L Gates LLP

(57) ABSTRACT

Provided is a tuner device including: a box-shaped metal tuner case; a plurality of connectors which are attached to one surface of the tuner case; a plurality of connection pins for signal transmission, the pins being provided on the other surface of the tuner case; and at least one foot electrode which is provided in the vicinity of the connection pins and is grounded.

10 Claims, 11 Drawing Sheets

A

B

(56) References Cited

U.S. PATENT DOCUMENTS

| | | | | |
|---|---|---|---|---|
| 2007/0148996 A1* | 6/2007 | Hildebrand | .......... | H01Q 1/1214 |
| | | | | 439/63 |
| 2008/0068114 A1* | 3/2008 | Inaba | ..................... | H05K 9/006 |
| | | | | 334/85 |
| 2011/0205710 A1* | 8/2011 | Kondo | ............... | H05K 7/20436 |
| | | | | 361/714 |

FOREIGN PATENT DOCUMENTS

| | | | |
|---|---|---|---|
| CN | 102474660 A | | 5/2012 |
| CN | 103733524 A | | 4/2014 |
| JP | 2003-234971 A | | 8/2003 |
| JP | 2012-156690 A | | 8/2012 |
| JP | 2012156690 A | * | 8/2012 |

OTHER PUBLICATIONS

International Search Report issued in International Patent Application No. PCT/JP2019/011629 dated Jun. 11, 2019 and English translation of same. 5 pages.

Written Opinion issued in International Patent Application No. PCT/JP2019/0116290 dated Jun. 11, 2019. 6 pages.

Sony commercializes the industry's first ISDB-S3 1-7 compatible demodulator LSI and tuner modules for 4K and 8K satellite digital broadcasts, News Releases [online] [retrieved on May 31, 2019], Sony, Jul. 27, 2016, pp. 1-3, Internet URL <https://www.sony.net/Sonyinfo/News/Press/201607/1 6-069E/index.html>. 4 pages.

Takeshi, Usami et al., Broadcast Engineering, Kenroku Kan Publishing Co., Ltd., non-official translation (Outline of 4K Test Broadcast by Lefthand Circular Polarization), vol. 70, Sep. 2017, pp. 60-64.

* cited by examiner

A

B

TUNER DEVICE

TECHNICAL FIELD

The present technique relates to a tuner device used for receiving advanced wide band satellite digital broadcasting.

BACKGROUND ART

In current satellite digital television broadcasting, television signals are transmitted at an intermediate frequency (referred to as IF as appropriate; also, the word "IF" is used to represent both the intermediate frequency and intermediate frequency signals) of approximately 1 GHz to 2.1 GHz. However, advanced wide band satellite digital broadcasting (referred to as advanced BS broadcasting as appropriate) scheduled for practical broadcasting in 2018 will have the IF extended approximately up to 2.1 GHz to 3.2 GHz in order to provide 4K/8K ultra-high definition television broadcasting.

Due to such extension of the frequency band, there is a concern about mutual interference with other wireless systems (Wi-Fi (registered trademark)). For example, there is a possibility that a data transmission rate of Wi-Fi (registered trademark) may be slowed due to interference of leaked IF signals. In addition, there is a possibility that radio waves from devices used in daily life such as microwave ovens may enter reception equipment for the advanced BS broadcasting, which may result in reception failure. Under these circumstances, a law for establishing the following technical standards regarding radio wave leakage or the like from reception equipment for satellite broadcasting has been enacted (see NPL 1).

Frequency: 2224.41 to 3223.25 MHz

Leakage standard (limit of secondarily occurring radio wave leakage): −49.1 dBm or less (46.2 dBμV/m or less at a distance of 3 m)

Bandwidth: per 33.7561 MHz

CITATION LIST

Non Patent Literature

[NPL 1]
Ministry of Internal Affairs and Communications Ordinance No. 76, Partial revision of radio equipment regulations (Article 24)

SUMMARY

Technical Problem

In existing tuner devices for receiving BS broadcasting, it was difficult to meet the standards regarding radio wave leakage stipulated by the law described above.

Therefore, it is an object of the present technique to provide a tuner device for receiving advanced BS broadcasting in which radio wave leakage can be further inhibited.

Solution to Problem

The present technique relates to a tuner device including a box-shaped metal tuner case, a plurality of connectors which are attached to one surface of the tuner case, a plurality of connection pins for signal transmission which are provided on the other surface of the tuner case, and at least one foot electrode which is provided near the connection pins and grounded.

Advantageous Effects of Invention

According to at least one embodiment, radio wave leakage from the tuner device can be further inhibited. Also, the effects described here are not necessarily limiting, and any one of the effects described in the present technique or an effect different from them may be obtained. Further, the content of the present technique should not be interpreted limitedly according to the effects illustrated in the following description.

DESCRIPTION OF EMBODIMENTS

The embodiment described below is a preferred specific example of the present technique and various technically preferable limitations are applied thereto. However, the scope of the present technique is not limited to the embodiment unless otherwise specified in the description below.

Also, the description of the present technique will be given in the following order.

<1. Problems in advanced BS broadcasting>
<2. One embodiment of present technique>
<3. Modified example>

1. Problems in Advanced BS Broadcasting

Figure 10:
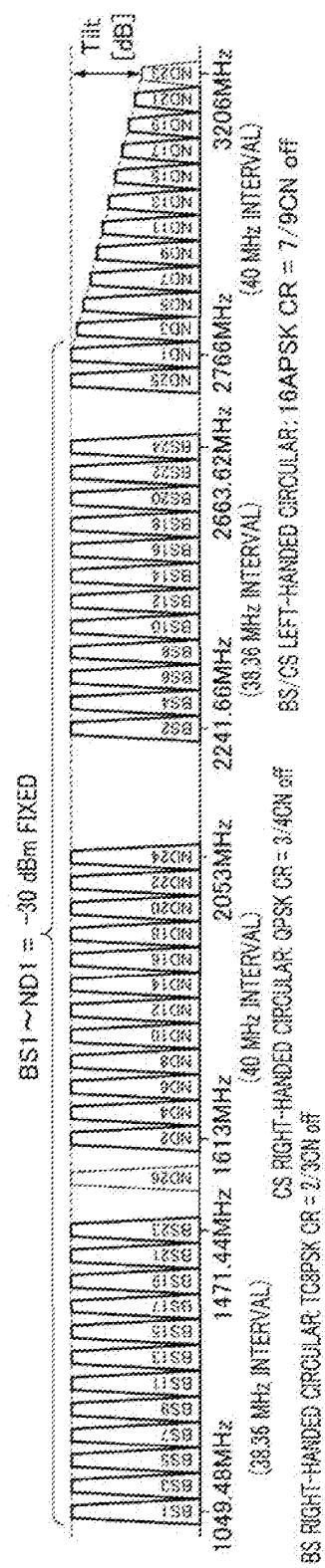
FIG. 10 is a diagram showing a frequency arrangement used for explaining advanced BS broadcasting.

Problems in advanced BS broadcasting will be described with reference to FIGS. 10 and 11. FIG. 10 shows frequencies of the IF in the advanced BS broadcasting. For example, the center frequency of the IF of channel number BS-1 is 1049.48 MHz. Channels of BS-3, BS-5, BS-7, . . . , and BS-23 are disposed in order. The center frequency of the IF of channel number BS-23 is 1471.44 MHz. CS-IF is disposed in a frequency band higher than the IF of the BS. For example, the center frequency of the IF of channel number ND-2 is 1613 MHz, and channels of ND-2, ND-4, ND-6, . . . , and ND-24 are disposed in order. For example, the center frequency of the IF of channel number ND-24 is 2053 MHz. The IFs of BS-1 to BS-23 and ND-2 to ND-24 are channels of existing BS broadcasting and CS broadcasting and radio waves thereof are right-handed circularly polarized waves.

Left-handed circularly polarized waves are used in the advanced BS broadcasting. That is, channel numbers BS-2, BS-4, . . . , and BS-24 and channel numbers ND-1, ND-3, ND-5, . . . , and ND-23 are channels of left-handed circularly polarized waves. For example, the center frequency of channel number BS-2 is 2241.66 MHz, and the center frequency of channel number BS-24 is 2663.62 MHz. Also, the center frequency of channel number ND-1 is 2766 MHz, and the center frequency of channel number ND-23 is 3206 MHz.

Figure 11:
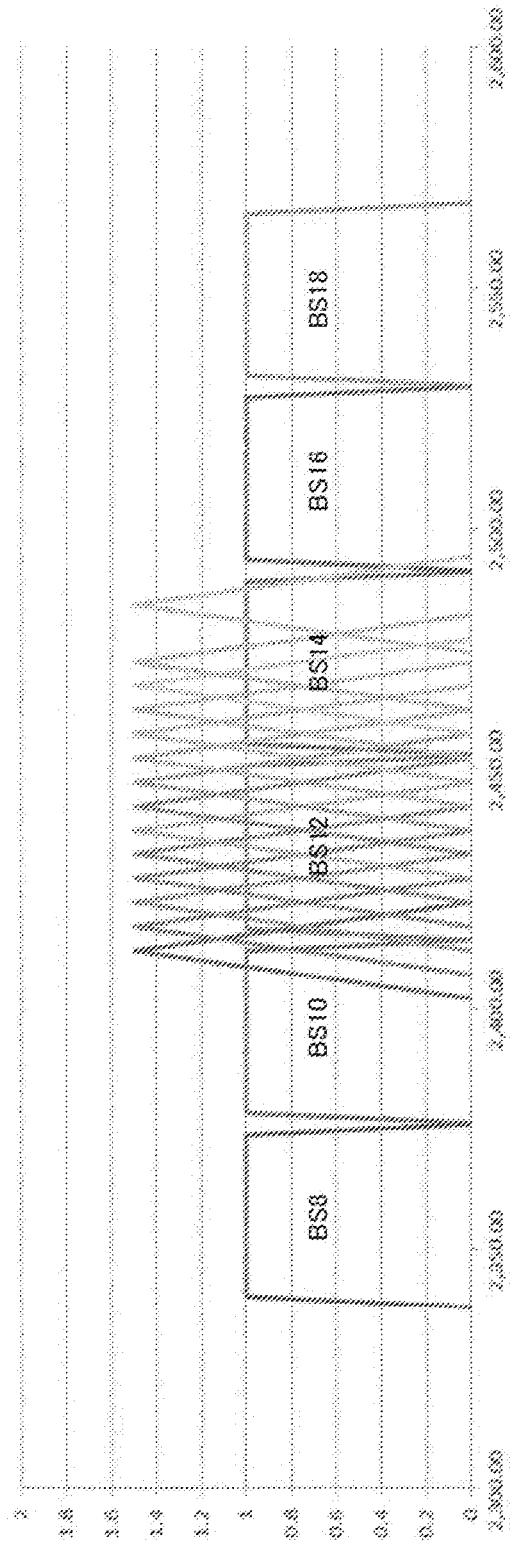
FIG. 11 is a diagram for explaining overlapping of frequency bands.

As shown in FIG. 11, in frequency bands of channel numbers BS-12 and BS-14, there are interference radio waves resulting from unnecessary radiation generated in other wireless systems (Wi-Fi (registered trademark)) or industrial devices such as microwave ovens. Therefore, since radio wave leakage from a tuner device in these frequency bands interferes with other wireless systems, it must be inhibited. Further, since interference waves may affect the tuner device and cause reception failure, it is necessary to prevent the tuner device from being affected by the interference waves.

2. One Embodiment of Present Technique

Figure 1:
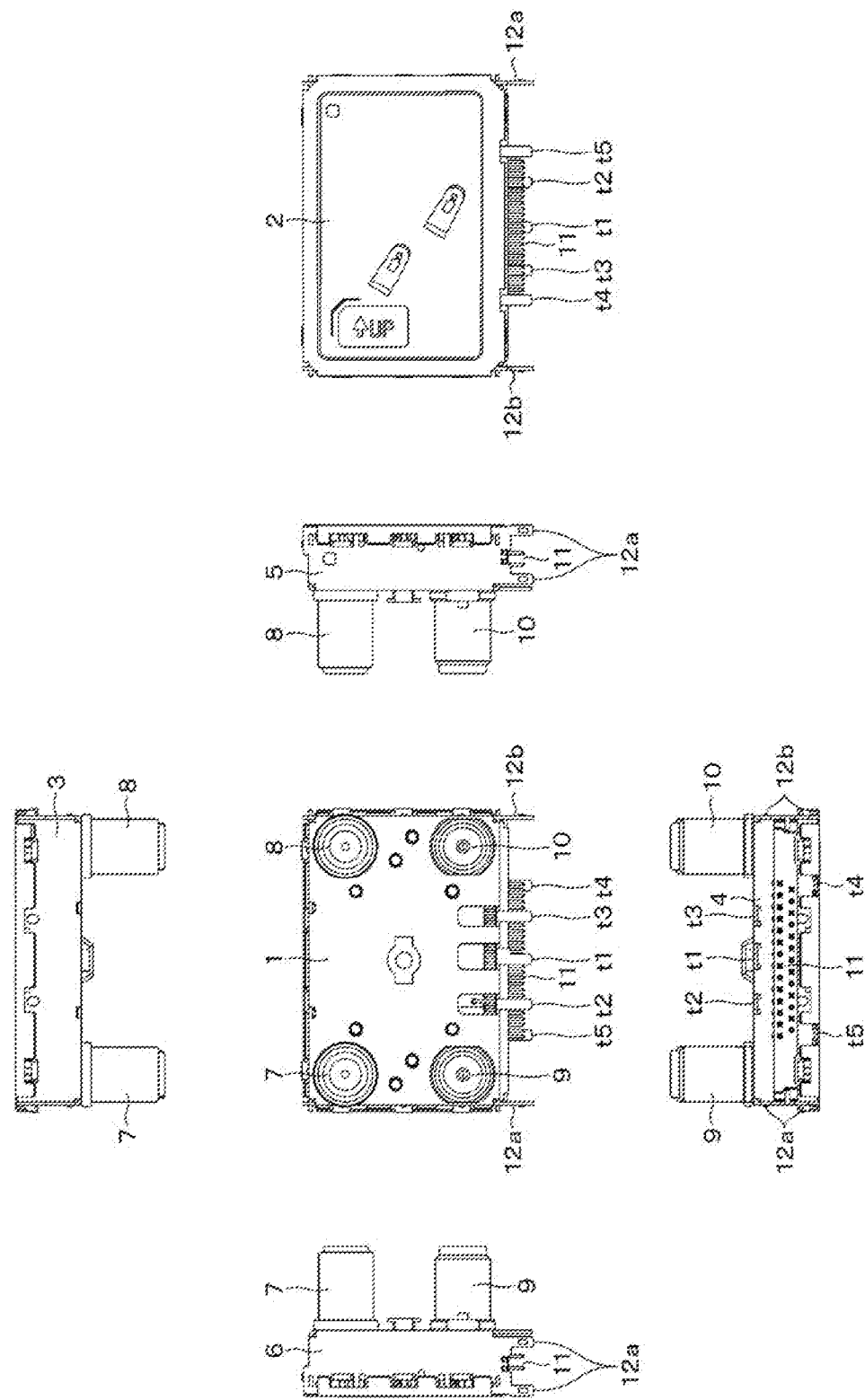
FIG. 1 is a six-sided view of one embodiment of the present technique.
Figure 2:
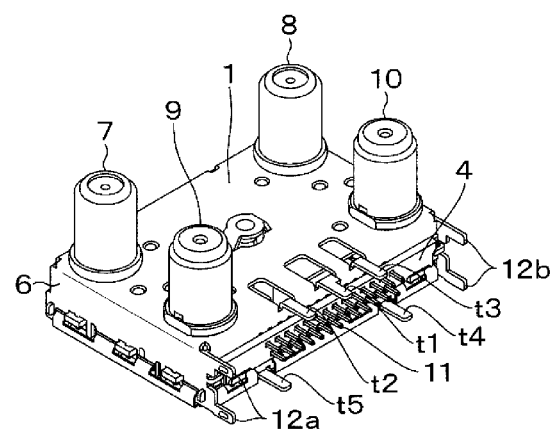
FIG. 2 is a perspective view and a partially enlarged view of one embodiment of the present technique.
Figure 2:
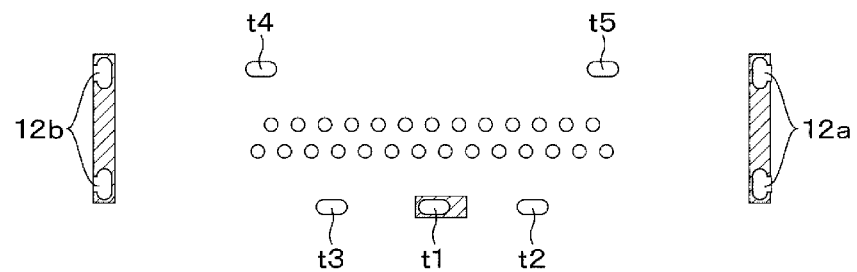

An embodiment of the present technique will be described with reference to FIGS. 1, 2, and 3. FIG. 1 is a six-sided view of a tuner device. A tuner case is made of a metal and has a box shape with a front surface 1, a back surface 2, an upper surface 3, a lower surface 4, a right side surface 5, and a left side surface 6. Four connectors 7, 8, 9, and 10 are provided on one of the front surface 1 and the rear surface 2, for example, on the front surface 1. These connectors 7 to 10 are provided in regions near each of four corners of the front surface 1.

For example, a width of the tuner case in a height direction thereof (a distance between the upper surface 3 and the lower surface 4) is slightly smaller than a width of a back panel of a device such as a recorder, and when attached to the recorder, it is configured such that no unnecessary space is generated above or below the tuner device in a case of the recorder. Also, the tuner case may be rotated 90 degrees and attached to a device such as a recorder. In that case, relationships between upper and lower sides and left and right sides are reversed.

The connectors 7 to 10 are coaxial connectors, for example, F-type connectors. One type of the F-type connectors is one that is connected to one end of a coaxial cable and is called an F-type connector plug or the like. Another type is an F-type connector that receives a central conductor (hereinafter referred to as a core wire) of a coaxial cable protruding from an F-type connector plug and is called an F-type connector receptacle or the like. The connectors 7 to 10 are F-type connector receptacles. However, for the connectors 7 to 10, a configuration other than the F-type connector, for example, an International Electrotechnical Commission (IEC) connector, may be used.

A plurality of connection pins 11 for signal transmission are provided on one of the upper surface 3 and the lower surface 4 of the tuner case, for example, on the lower surface 4. Attachment electrodes 12a and 12b protrude at both left and right ends of the lower surface 4. The attachment electrodes 12a and 12b are grounded electrodes. The tuner device according to one embodiment of the present technique is applied to, for example, a Blu-ray Disc (registered trademark) recorder (hereinafter simply referred to as a recorder), a hard disk recorder, or a set-top box (STB).

For example, the tuner device is attached such that the connectors 7 to 10 protrude from a back panel of the recorder and the back panel and the front surface 1 of the tuner device are substantially parallel to each other. The connection pins 11 on the lower surface 4 of the tuner device are connected to a circuit board in the recorder. The attachment electrodes 12a and 12b are combined with this circuit board.

Although not shown, frequency conversion is performed by a converter received by a BS reception antenna, thereby forming the IF. The IF is supplied to the connectors of the tuner device via a coaxial cable serving as a connection cable. For example, a received signal of a terrestrial digital broadcast is input to the connector 7, and an RF signal of the terrestrial digital broadcast is output from the connector 8. Also, for example, the IF of a satellite broadcast is input to the connector 9, and the IF of the satellite broadcast is output from the connector 10. The output signals from the connectors 8 and 10 are supplied to the recorder.

The configuration of the tuner device described above has an advantage that, when it is attached to a device such as the recorder, a thickness thereof can be made smaller than that of a tuner device having connectors provided on the upper surface 3 instead of the front surface 1, for example. On the other hand, since distances between the connectors 9 and 10 and the connection pin 11 become shorter, for example, the IF leaked from the vicinity of the connectors may be radiated by using the connection pins 11 as antennas, and thus radio wave leakage may increase.

In one embodiment of the present technique, by providing at least one foot electrode that is grounded in the vicinity of the connection pins 11, radio wave leakage is inhibited. In one embodiment, a plurality of, for example, five, foot electrodes t1, t2, t3, t4 and t5 are provided to surround an outer periphery of an installation region (for example, a substantially band-shaped region) of the connection pins 11.

The foot electrodes t1, t2, and t3 protrude from the front surface 1 of the tuner case (grounded) and are electrically and mechanically connected to the front surface 1. The foot electrodes t4 and t5 protrude from the lower surface 4 and are electrically and mechanically connected to the lower surface 4. Also, the foot electrodes t1 to t5 are soldered to a ground pattern on a wiring board such as the recorder. By providing these foot electrodes t1 to t5, it is possible to prevent the IF leaking from the vicinity of the connectors from flowing to the ground through the foot electrodes t1 to t5 and being radiated to the outside. In addition, radio waves in a band overlapping the IF from the outside can be flowed to the ground, and reception failure from external radio waves can be prevented. An upper side of FIG. 2B is a side on which signal lines to a subsequent television receiving circuit are disposed, and a lower side thereof is a side on which the connectors 7 to 10 are disposed. Since the signal lines from each connection pin to the subsequent television receiving circuit are disposed on the board on the side on which the signal lines to the subsequent television receiving circuit are disposed, the foot electrodes cannot be disposed in the vicinity of the connection pins 11 (that is, at a signal line arrangement part).

Figure 3:
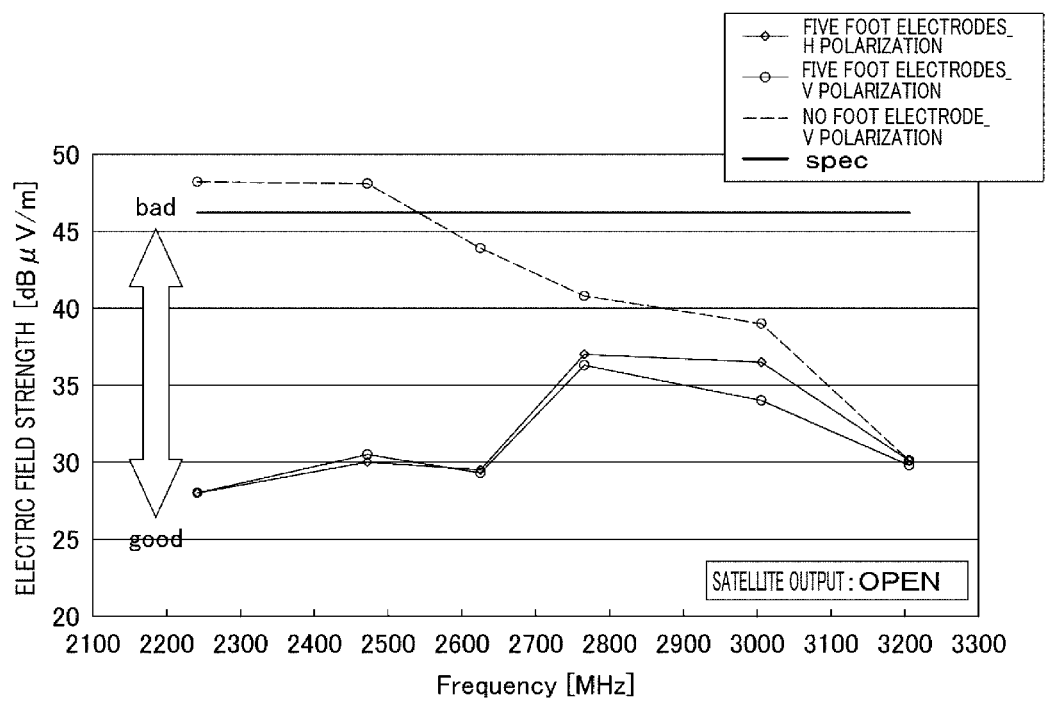
FIG. 3 is a graph used for explaining one embodiment of the present technique.

FIG. 3 shows measurement results of IF leakage of the advanced BS broadcasting of the above-described embodiment, for example, results when the measurement is performed using a predetermined method defined by legal regulations. In FIG. 3, the horizontal axis represents frequency and the vertical axis represents electric field strength. Also, the horizontal line parallel to the frequency axis is a standard defined by legal regulations. In the case of a tuner device without the foot electrodes, there is a frequency band in which polarization exceeds the allowable standard. On the other hand, in the embodiment of the present technique in which the five foot electrodes are provided, the measured H polarization and V polarization can both be equal to or less than the allowable standard.

Figure 4:
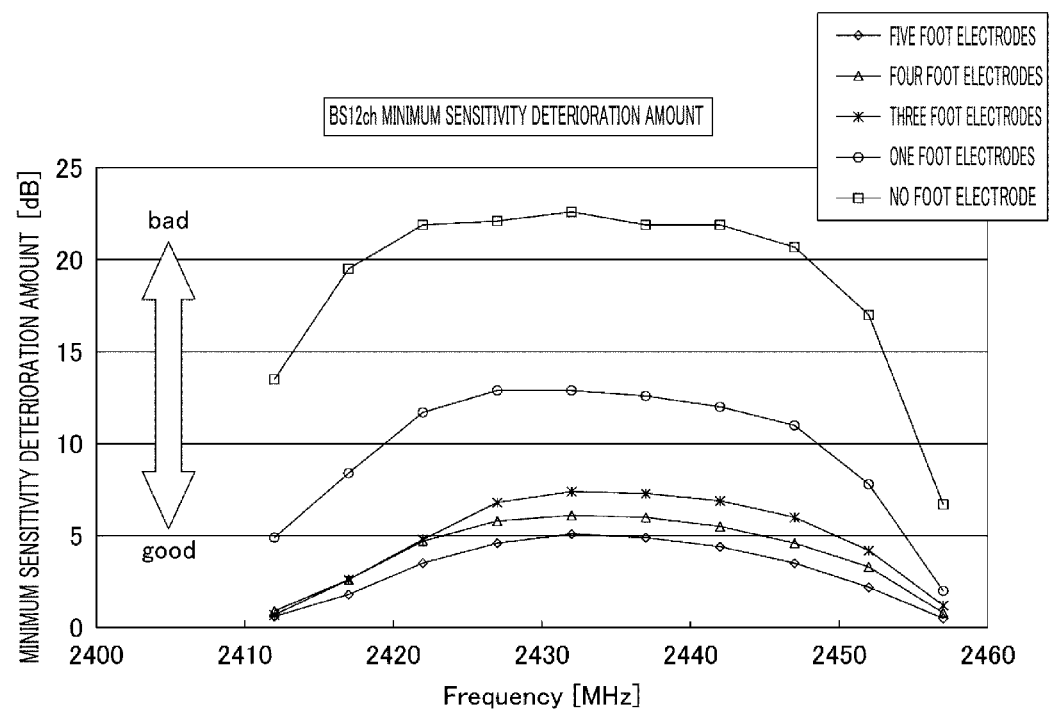
FIG. 4 is a graph used for explaining one embodiment of the present technique.

FIG. 4 shows confirmation results of Wi-Fi (registered trademark) interference characteristics. The horizontal axis represents frequency and the vertical axis represents a minimum sensitivity deterioration amount. Since the minimum sensitivity represents the minimum radio waves that can be received, a larger minimum sensitivity deterioration amount means a decrease in reception performance. As shown in FIG. 4, the reception performance is lowest when the foot electrodes are not provided. In addition, the reception performance is improved even when only one foot electrode is provided. Further, as the number of foot electrodes is increased to 3, 4, and 5, the reception performance can be improved. For example, in a case in which one foot electrode is provided, effects of leakage prevention and interference resistance can be enhanced by providing it at a central part on a side on which a width of the connection pins 11 is wider. This corresponds to the foot electrode t1 in FIG. 2B. Further, the foot electrode t1 is preferably located at a center position between the attachment electrodes 12a and 12b. In a case in which three foot electrodes are provided, it is effective to dispose the foot electrodes to surround the connection pins 11 at constant intervals. In FIG. 2B, these correspond to the foot electrodes t1, t4, and t5. Further, in a case in which four foot electrodes are provided, similarly, two foot electrodes are disposed near the foot electrodes t1, t2 or t3 in FIG. 2B, and two foot electrodes t4 and t5 are disposed in addition thereto. Also, positions of the foot electrodes on the connector arrangement side may differ from the illustrated positions.

Figure 5:
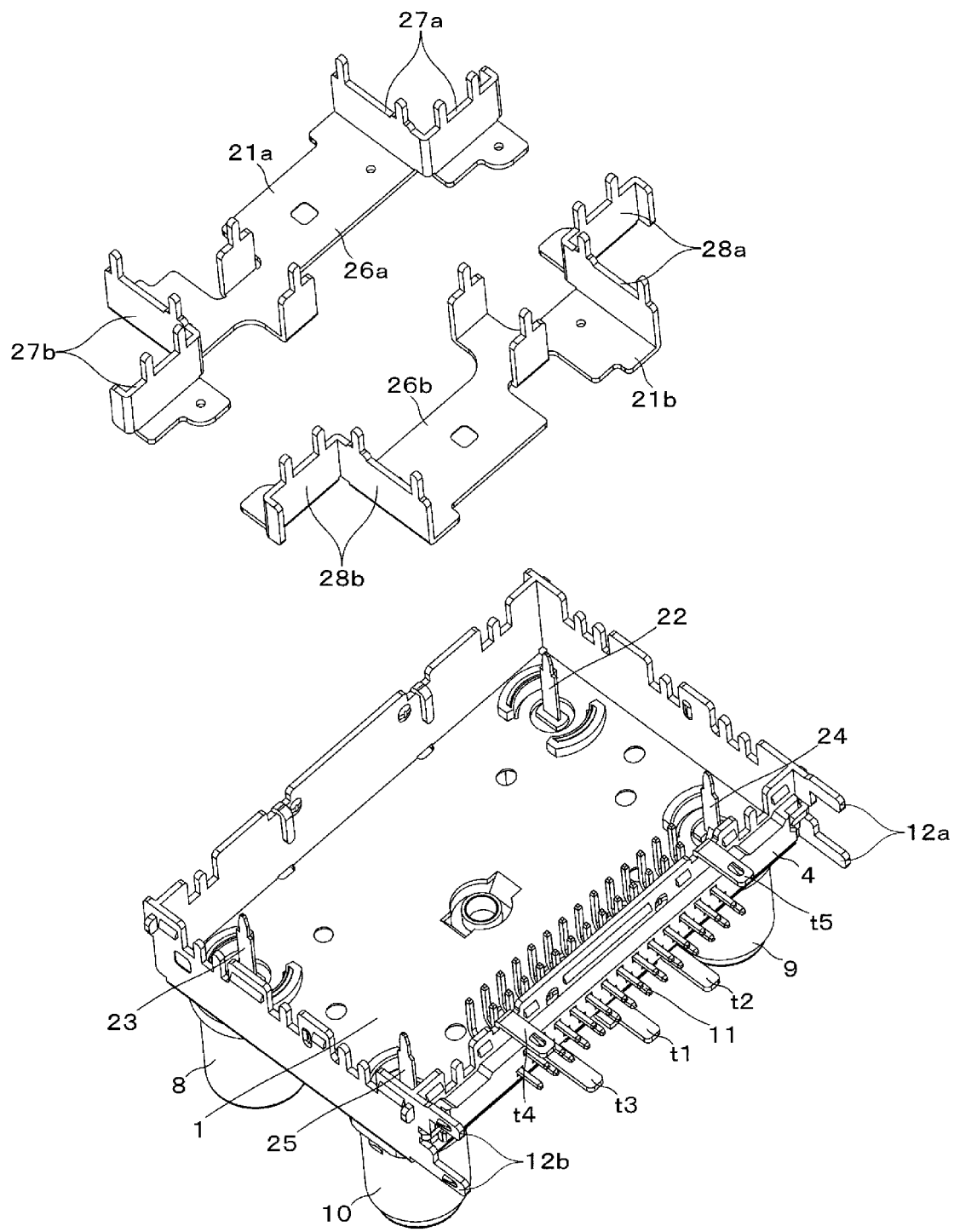
FIG. 5 is a perspective view used for explaining an internal structure of one embodiment of the present technique.

FIG. 5 is a perspective view showing an internal structure with the circuit board and a lid removed. Brackets 21a and 21b for shielding are attached to the inside of the front surface 1 of the tuner case. The four connectors 7 to 10 are attached using attachment holes provided near each of the four corners of the front surface 1. For a method of attaching the connectors, caulking or the like can be used. Outer conductors of these connectors are made of a metal such as iron, brass or zinc, and are mechanically and electrically connected to the tuner case.

Connection pieces 22, 23, 24, and 25 connected to the core wire (central conductor) of the coaxial cable connected to each connector protrude into the tuner case. These connection pieces 22 to 25 are each connected to signal power supply parts on the circuit board (not shown). Further, a large number of interface connection pins 11 for transmitting and receiving data, signals and the like to and from external circuits are implanted in the lower surface 4. The connection pins 11 are attached to a device in which the tuner device is incorporated, for example, the circuit board of the recorder.

The brackets 21a and 21b are, for example, bent metal plates having shielding effects, and have the same shape. The brackets 21a and 21b, which are separate parts from the tuner case, are provided for shielding in order to avoid a gap from being created in the tuner case when the tuner case is processed into a shape for shielding, which would impair the shielding effect of the tuner case.

The brackets 21a and 21b have connecting parts 26a and 26b and shielding parts 27a, 27b, 28a, and 28b formed at both respective ends of the connecting parts 26a and 26b. The shielding parts 27a, 27b, 28a and 28b have first and second plate-shaped members whose one end surfaces are joined to each other, and the other end surfaces of the first and second plate-shaped members are joined to inner surfaces of peripheral surface members near the corners of the tuner case.

The shielding part 27a surrounds the periphery of the connection piece 22 of the connector 7, and the shielding part 27b surrounds the periphery of the connection piece 23 of the connector 8. The shielding part 28a surrounds the periphery of the connection piece 24 of the connector 9, and the shielding part 28b surrounds the periphery of the connection piece 25 of the connector 10. Therefore, it is possible to shield electromagnetic waves radiated from each connection piece.

The places at which shielding measures are required are a region of the connection piece 22 to which the IF of the advanced BS broadcasting is input and a region of the connection piece 23 to which the IF of the advanced BS broadcasting is output. It is less necessary to shield regions of the connection pieces 24 and 25 for digital terrestrial broadcasting. However, if the positions for connecting the connectors for advanced BS broadcasting are fixed, inconvenience arises when the tuner case is rotated or when the specifications are different for different manufacturers. Therefore, it is possible to improve versatility by providing shielding measures for all connector positions.

Also, the shapes of the brackets 21a and 21b for shielding are examples, and various other shapes are possible. For example, four separate brackets may be used to separately surround the four corners.

Improvement of the shielding effect will be described with reference to the drawings. As an example, in a case in which an IF signal in a newly added frequency region having a center frequency of 2.427 GHz and a frequency range of about 30 MHz is input to the connector 7 and this IF signal is output from the connector 8, a level of interference waves of the above-mentioned frequency is measured at the connector 10 for digital terrestrial broadcasting.

Figure 6:
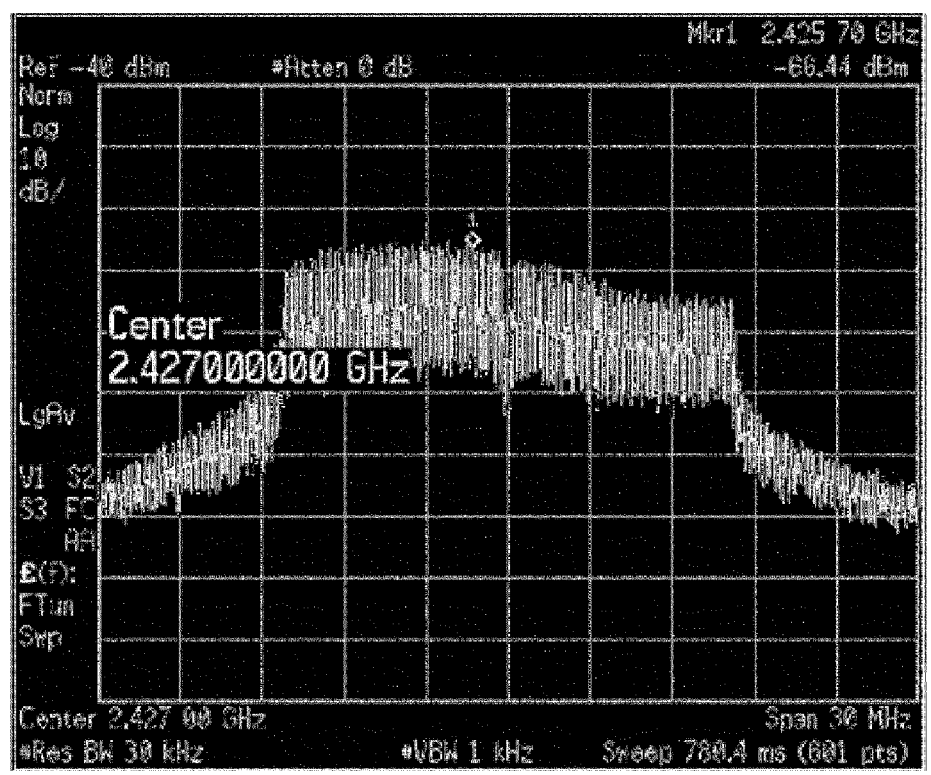
FIG. 6 is a diagram showing a passage characteristic of interference waves to a signal terminal in a conventional model.
Figure 7:
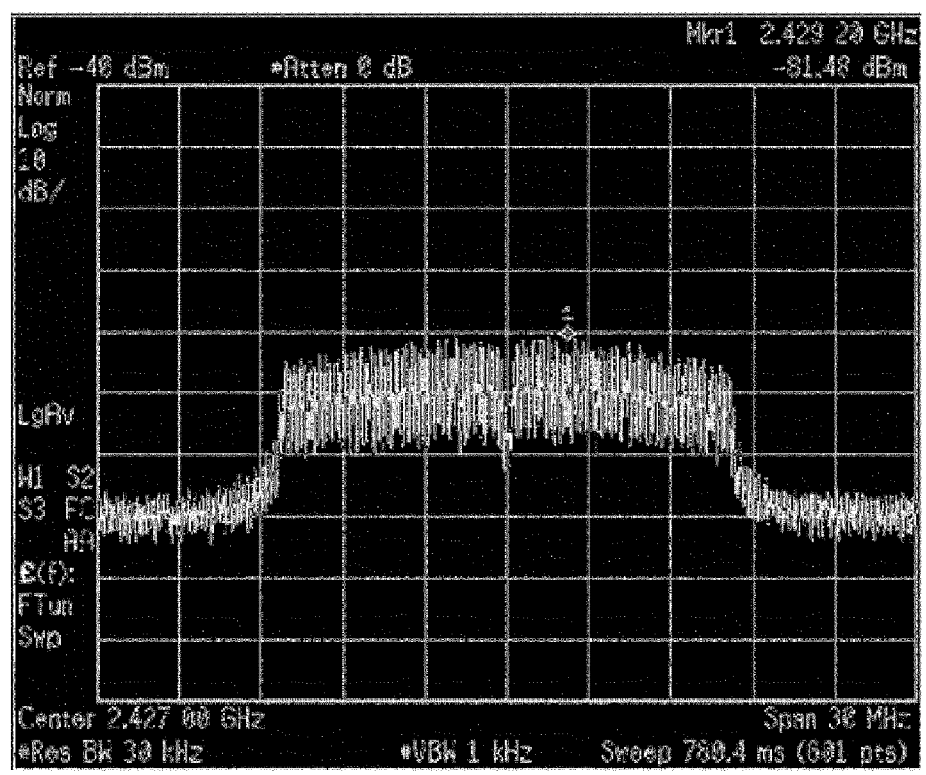
FIG. 7 is a diagram showing a passage characteristic of interference waves to a signal terminal according to one embodiment of the present technique.

FIG. 6 shows a passage characteristic of interference waves with respect to a conventional tuner device that does not have a shielding measure, and FIG. 7 shows a passage characteristic of interference waves with respect to the tuner device in which the shielding measure is made by the present technique. From these measurement results, it is understood that, according to the present technique, improvement in the characteristics of about 25 dB is expected, and the shielding properties can be enhanced.

Further, a configuration for enhancing the shielding effect will be described. The connection pin 11 contributes to radiation of interference waves as an antenna. In order to inhibit influence of the connection pin 11, a capacitor having a small capacitance, which is effective in the frequency band of the advanced BS broadcasting and has little effect on each signal line and power supply line, is inserted to the connection pin 11 as a bypass capacitor. By this measure, it is possible to realize further improvement in interference wave resistance.

Figure 8:
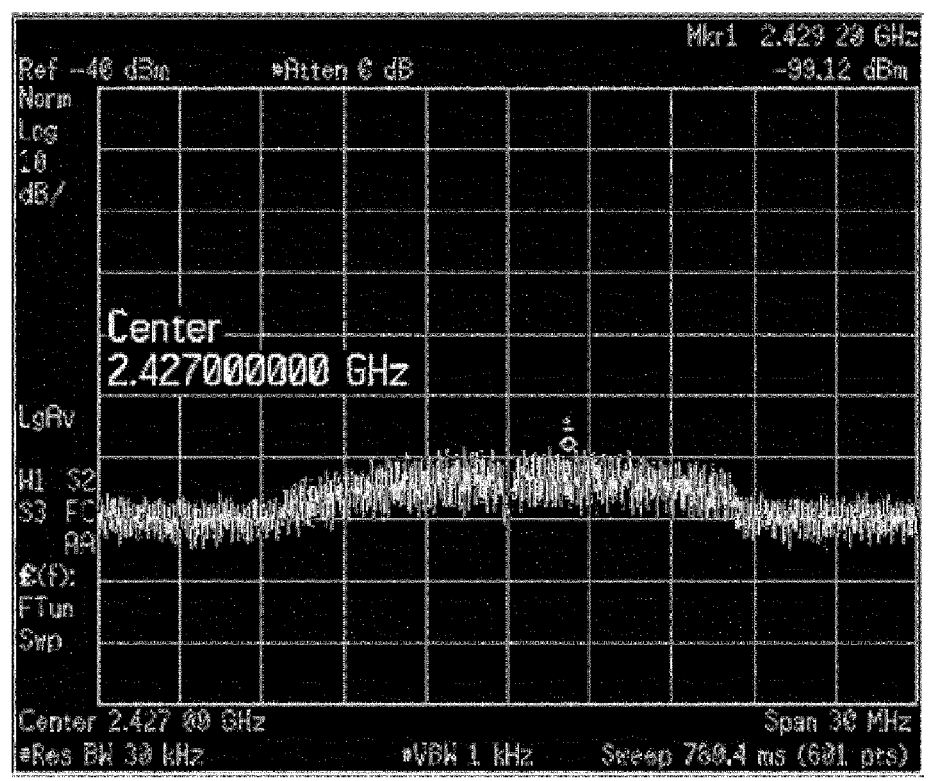
FIG. 8 is a diagram showing a passage characteristic of interference waves to a signal terminal according to one embodiment of the present technique.

FIG. 8 shows a passage characteristic of interference waves after the bypass capacitor is connected. As can be seen from FIG. 8, as a result of implementing this measure, an improvement effect of about 33 dB was confirmed as compared with the conventional characteristic shown in FIG. 6.

Also, when there is no space to provide a bypass capacitor for the connection pin 11, it is preferable to set the connectors in two regions separate from the connection pins 11 as the input terminal and the output terminal for BS broadcasting.

Figure 9:
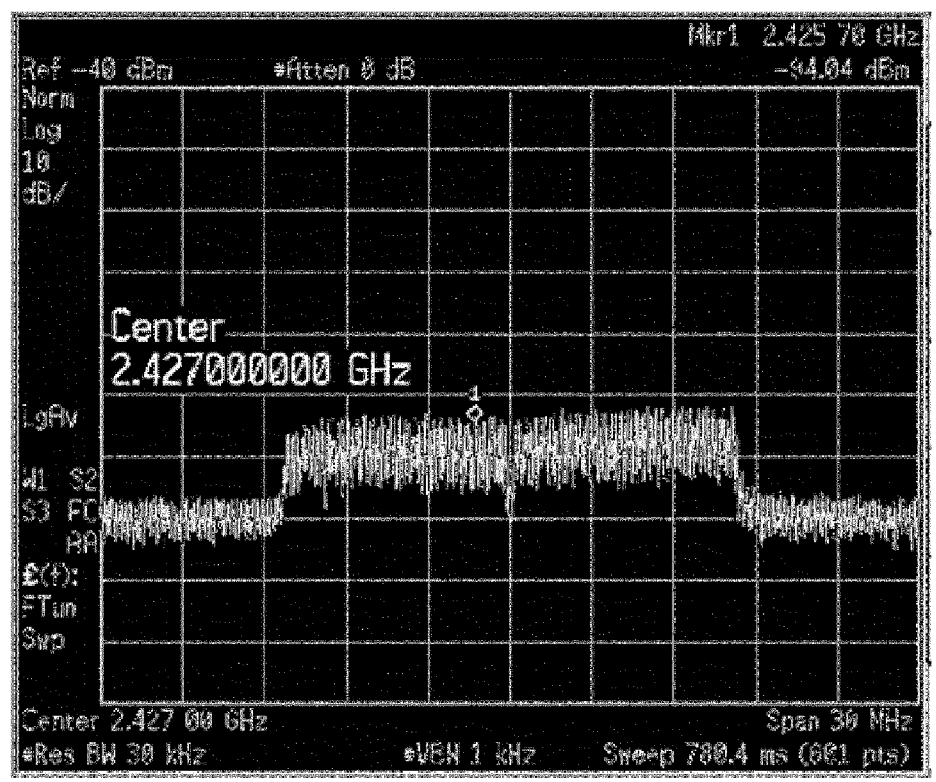
FIG. 9 is a diagram showing a passage characteristic of interference waves to a signal terminal according to one embodiment of the present technique.

FIG. 9 shows a passage characteristic of interference waves when the connectors at positions apart from the connection pins 11 are used. FIG. 9 shows a passage characteristic of interference waves with respect to the connection piece 23, and as can be seen from FIG. 9, an improvement effect of about 28 dB can be confirmed as compared with the conventional characteristic shown in FIG. 6.

With the present technique described above, the tuner device having an excellent shielding effect on interference and radiation from various interference waves generated by the IF in the newly added frequency region (2.1 GHz to 3.2 GHz) compatible with the advanced BS broadcasting (4K/8K broadcasting) can be configured. Further, by providing the connector at each corner of the tuner case and performing the shield measure for each connector, it is possible to freely set the connector that handles the IF in the newly added frequency region of the advanced BS broadcasting, so that a configuration with excellent versatility can be provided.

3. Modified Example

Although embodiments of the present technique have been specifically described above, the present technique is not limited to the above-described embodiments, and various modifications based on the technical idea of the present technique are possible. For example, the foot electrodes t1 to t5 may protrude from the brackets inside the tuner case. Also, the configurations, methods, steps, shapes, materials, numerical values, and the like of the above-described embodiments can be combined with each other without departing from the gist of the present technique.

Further, the present technique may also be configured as below.

(1)

A tuner device includes:

a box-shaped metal tuner case;

a plurality of connectors which are attached to one surface of the tuner case;

a plurality of connection pins for signal transmission, the pins being provided on the other surface of the tuner case; and at least one foot electrode which is provided in the vicinity of the connection pins and grounded.

(2)

The tuner device according to (1), wherein a plurality of the foot electrodes are provided so as to surround an installation region of the connection pins.

(3)

The tuner device according to (1) or (2), wherein the tuner case has a front surface, a back surface, an upper surface, a lower surface, a left side surface and a right side surface, a plurality of connectors are provided on one of the front surface and the back surface, and the connection pins and the foot electrodes are provided on one of the upper surface and the lower surface.

(4)

The tuner device according to any one of (1) to (3), wherein four connectors are each attached to regions in the vicinities of four corners of one surface of the tuner case, and a shielding part separate from the tuner case is provided in each of the regions in the vicinities the four corners inside the tuner case.

(5)

The tuner device according to (4), wherein the shielding part has first and second plate-shaped members whose one end faces are joined to each other, and the other end surfaces of the first and second plate-shaped members are each joined to inner surfaces of peripheral surface members in the vicinities of the corners of the tuner case.

(6)

The tuner device according to any one of (1) to (5), wherein received signals of satellite digital broadcasting are transmitted through the plurality of connectors, and an IF signal of the satellite digital broadcasting is transmitted through the connection pins.

(7)

The tuner device according to (6), wherein the digital satellite broadcasting is advanced BS broadcasting.

REFERENCE SIGNS LIST

1 Front surface
2 Back surface
3 Upper surface
4 Lower surface
5 Right side surface
6 Left side surface
7, 8, 9, 10 Connector
11 Connection pin
t1-t5 Foot electrode
21a, 21b Bracket
27a, 27b, 28a, 28b Shielding part

The invention claimed is:

1. A tuner device includes:
    a box-shaped metal tuner case;
    at least four coaxial connectors which are attached to one surface of the box-shaped metal tuner case;
    a plurality of connection pins for signal transmission, the pins being provided on another surface of the box-shaped metal tuner case; and
    at least one foot electrode which is provided in the vicinity of the connection pins and grounded,
    wherein four connectors are each attached to regions in the vicinities of four corners of the one surface of the box-shaped metal tuner case.

2. The tuner device according to claim 1, wherein a plurality of the foot electrodes are provided so as to surround an installation region of the connection pins.

3. The tuner device according to claim 1,
    wherein the box-shaped metal tuner case has a front surface, a back surface, an upper surface, a lower surface, a left side surface and a right side surface,
    the at least four coaxial connectors are provided on one of the front surface and the back surface, and
    the connection pins and the foot electrodes are provided on one of the upper surface and the lower surface.

4. The tuner device according to claim 1,
    wherein a shielding part, which is a separate part from the box-shaped metal tuner case, and which is provided inside the tuner case at each of the regions in the vicinities of the four corners.

5. The tuner device according to claim 4,
wherein the shielding part has first and second plate-shaped members which each have one end joined to each other, and
another end of each of the first and second plate-shaped members, which is opposite the joined one end, are each joined to inner surfaces of peripheral surface members in the vicinities of the four corners.

6. The tuner device according to claim 1,
wherein received signals of satellite digital broadcasting are transmitted through the at least four coaxial connectors, and
an IF signal of the satellite digital broadcasting is transmitted through the connection pins.

7. The tuner device according to claim 6, wherein the digital satellite broadcasting is advanced BS broadcasting.

8. The tuner device according to claim 5, wherein the joined one end and the other end of each of the first and second plate-shaped members are parallel to each other.

9. The tuner device according to claim 8, wherein each of the joined one end and the other end of each of the first and second plate-shaped members are parallel to a surface of the box-shaped metal tuner case on which the at least one foot electrode is provided.

10. The tuner device according to claim 9, wherein the surface of the box-shaped metal tuner case on which the at least one foot electrode is provided has four or more foot electrodes provided thereon and surrounding an installation region of the connection pins.

\* \* \* \* \*